United States Patent [19]

Eldridge et al.

[11] 4,368,220

[45] Jan. 11, 1983

[54] PASSIVATION OF RIE PATTERNED AL-BASED ALLOY FILMS BY ETCHING TO REMOVE CONTAMINANTS AND SURFACE OXIDE FOLLOWED BY OXIDATION

[75] Inventors: Jerome M. Eldridge, Saratoga; Michael H. Lee, San Jose, both of Calif.; Geraldine C. Schwartz, Poughkeepsie, N.Y.

[73] Assignee: International Business Machines Corporation, Armonk, N.Y.

[21] Appl. No.: 278,949

[22] Filed: Jun. 30, 1981

[51] Int. Cl.³ .................. H01L 21/283; H01L 21/306
[52] U.S. Cl. .................................... 427/255.4; 134/3; 156/643; 156/665; 156/667; 427/309; 427/318; 427/327; 427/399
[58] Field of Search .............. 156/665, 643, 667; 427/309, 399, 318, 327, 255.4; 134/3

[56] References Cited

U.S. PATENT DOCUMENTS

| | | | |
|---|---|---|---|
| Re. 28,015 | 5/1974 | Vermilyea et al. | 29/570 |
| 3,634,262 | 1/1972 | Grunwald et al. | 134/3 |
| 3,647,698 | 3/1972 | Bellinger et al. | 134/3 |
| 4,087,367 | 5/1978 | Rioult et al. | 156/667 |
| 4,089,709 | 5/1978 | Harris | 148/6.27 |
| 4,098,637 | 7/1978 | Bell | 156/644 |
| 4,183,781 | 1/1980 | Eldridge et al. | 156/643 |
| 4,235,648 | 11/1980 | Richardson | 156/667 |
| 4,267,013 | 5/1981 | Iida et al. | 156/665 |
| 4,308,089 | 12/1981 | Iida et al. | 156/665 |
| 4,314,855 | 2/1982 | Chang et al. | 134/3 |

OTHER PUBLICATIONS

J. Appl. Physics 52(4) Apr. 1981, pp. 2994–2999, Lee et al., "Reactive Ion Etching Induced Corrosion of Al and Al–Cu Films".

Primary Examiner—Jerome W. Massie
Attorney, Agent, or Firm—Henry E. Otto, Jr.; Nathan N. Kallman

[57] ABSTRACT

Aluminum-based alloy films and metallization layers that are patterned by reactive ion etching (RIE) are passivated by etching surface portions of the films or layers with a phosphoric-chromic mixture to remove contaminants and then oxidizing the exposed surface portions in an oxygen atmosphere.

5 Claims, 1 Drawing Figure

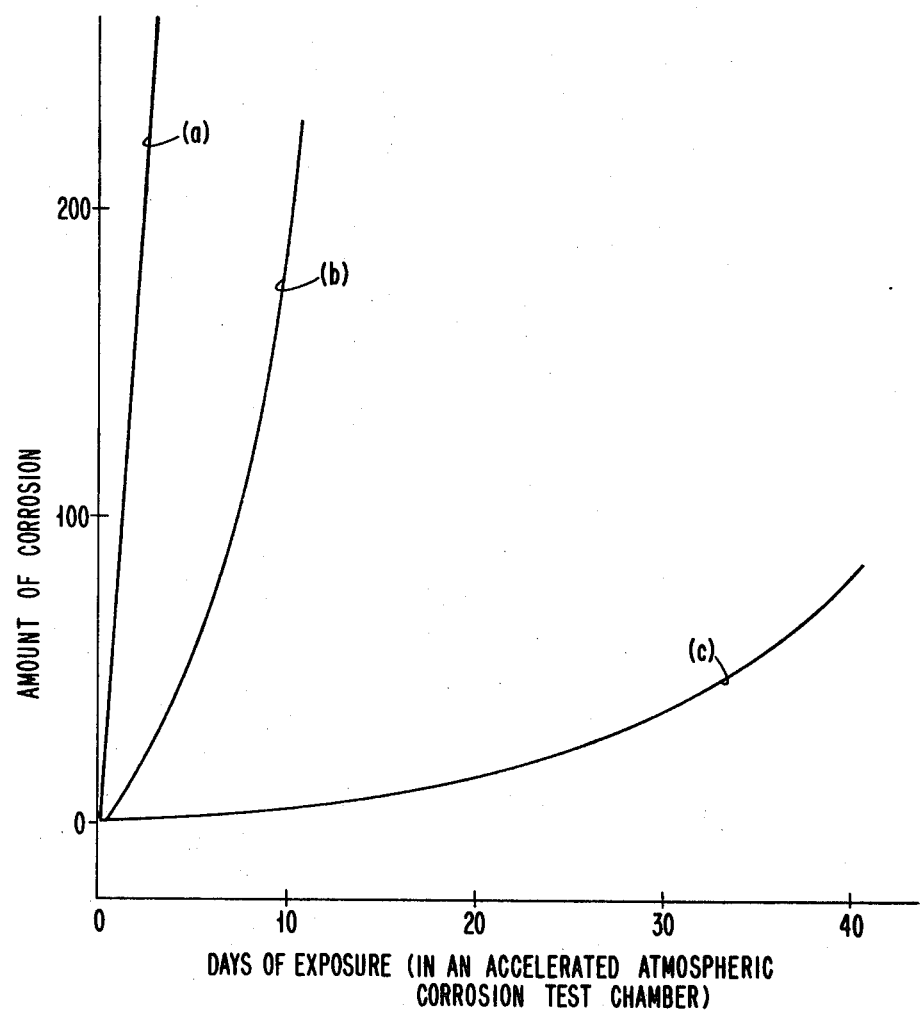

PASSIVATION OF RIE PATTERNED AL-BASED ALLOY FILMS BY ETCHING TO REMOVE CONTAMINANTS AND SURFACE OXIDE FOLLOWED BY OXIDATION

DESCRIPTION

1. TECHNICAL FIELD

This invention relates to the passivation of aluminum-based alloy films patterned by Reactive Ion Etching (RIE).

An object of this invention is to minimize the corrosion experienced by the films in room air, following the patterning process.

2. BACKGROUND ART

The patterning of aluminum-based metallizations e.g., Al-4% Cu by RIE is a process that can be used to manufacture microcircuit devices. Although RIE offers many advantages for microcircuit fabrication, it can promote atmospheric corrosion of the resultant Al or Al alloy conductor lines by introducing impurities (carbon and chlorine) and mechanical damage into the surface regions of the films. Consequently, the $Al_2O_3$ surface layer that forms upon exposure of the metal to room air is substantially inferior in its passivating ability. The problem has been partially solved by sequentially rinsing the etched metallization and oxidizing in 1 atmosphere $O_2$ at approximately 350° Centigrade, as disclosed in U.S. Pat. No. 4,183,781.

U.S. Pat. No. 4,183,781, issued to J. M. Eldridge et al, discloses a stabilization process for aluminum microcircuits that have been formed by RIE. The patent cites U.S. Pat. Nos. 4,026,742 and 4,057,460 as exemplary illustrations of manufacturing process of this type. The patents do not address the problem of corrosion experienced with the Reactive Ion Etching of aluminum-alloys.

BRIEF DESCRIPTION OF THE DRAWING

The drawing depicts a series of curves showing the relative amounts of Al corrosion versus the time of exposure in an accelerated atmospheric corrosion test chamber for two different prior art processes used to passivate reactively ion etched lines, and for the novel process of this invention.

DISCLOSURE OF THE INVENTION

In an implementation of this invention, a microcircuit is produced by an RIE process to delineate specified circuit patterns in an Al-4% Cu film, by way of example. The invention works with other alloys of Al as well. The film of aluminum-copper alloy, which may contain 4% copper, by way of example, is deposited in vacuum on a passivated silicon semicondoctor device substrate. The alloy film is patterned by RIE and then immediately rinsed in deionized water upon removal from the vacuum system.

In accordance with this invention, the following, novel processing steps are introduced to improve the corrosion resistance of the metallization layer. The first step is to strip the top air-formed oxide layer, which includes the bulk of impurities as well as a relatively small amount of the alloy below that. The oxidestripping is carried out in a phosporic-chromic acid etchant for approximately 2 minutes at about 55° to 80° C. A preferred etchant mixture is 50 grams $CrO_3$, and 90 milliliters $H_3PO_4$ in 2500 milliliters of water total. The film is then rinsed in deionized water for about 5 to 10 minutes at room temperature, and blown dry in filtered air or nitrogen. The metal is then oxidized in one atmosphere of pure oxygen for about 30 to 45 minutes at a temperature in the range of 300° to 350° C. This sequence of process steps may be repeated to further enhance corrosion resistance.

With reference to the drawing, the curve designated as (a) represents the prior art processing of the aluminum-copper material by reactive ion etching, with a water rinse. The amount of corrosion is substantial after a few hours of exposure in an accelerated atmospheric corrosion test chamber.

Curve (b) represents the prior art processing in which oxidation at 350° C. for 30 minutes in one atmosphere of oxygen follows the reactive ion etching, with water rinse. The amount of corrosion has been reduced substantially and occurs after several days of exposure in the test chamber.

Curve (c) depicts the corrosion effect occuring in the test chamber after employing the additional process steps of stripping in the phosphoric-chromic mixture and oxidizing in pure oxygen, in accordance with this invention. The improvement in passivation is much greater than that achieved with the process represented by curve (b).

What is claimed is:

1. A process for passivating a reactive ion etched aluminum based metallization patterned layer, said layer having an airformed oxide portion, comprising the steps of:

etching surface portions of said metallization layer with a phosphoric-chromic etchant solution to completely strip the oxide portion as well as a relatively small amount of the underlying aluminum patterned layer so as to remove substantially all contaminants; and oxidizing the exposed surface of said layer in an oxygen atmosphere.

2. A process as in claim 1, wherein said mixture is formed with 50 grams $CrO_3$, and 90 milliliters $H_3PO_4$ in 2500 milliliters of $H_2O$ total.

3. A process as in claim 1, wherein said etching step is accomplished for approximately two minutes at about 55° and 80° C.

4. A process as in claim 1, wherein said oxidizing step is accomplished in an atmosphere of pure oxygen for about 30-45 minutes at a temperature of about 300°-350° C.

5. A process according to claim 1, including the further steps, following the etching step and prior to the oxidizing step, of:

rinsing the etched surface portions in deionized water at room temperature and then, drying the etched portions in filtered air or nitrogen at elevated temperature.

* * * * *